(12) United States Patent
Guillot et al.

(10) Patent No.: US 10,644,696 B2
(45) Date of Patent: May 5, 2020

(54) POWER CIRCUIT SWITCHING DEVICE

(71) Applicant: Exagan, Grenoble (FR)

(72) Inventors: Laurent Guillot, Seysses (FR); Thierry Sutto, Seysses (FR); Eric Moreau, Frouzins (FR)

(73) Assignee: Exagan, Grenoble (FR)

( * ) Notice: Subject to any disclaimer, the term of this patent is extended or adjusted under 35 U.S.C. 154(b) by 0 days.

(21) Appl. No.: 16/464,222

(22) PCT Filed: Nov. 22, 2017

(86) PCT No.: PCT/FR2017/053208
§ 371 (c)(1),
(2) Date: May 24, 2019

(87) PCT Pub. No.: WO2018/096265
PCT Pub. Date: May 31, 2018

(65) Prior Publication Data
US 2019/0393875 A1    Dec. 26, 2019

(30) Foreign Application Priority Data

Nov. 25, 2016 (FR) ...................................... 16 61533
Feb. 2, 2017 (FR) ...................................... 17 50867

(51) Int. Cl.
*H03K 17/687* (2006.01)
*H03K 3/037* (2006.01)

(52) U.S. Cl.
CPC ......... *H03K 17/687* (2013.01); *H03K 3/0375* (2013.01)

(58) Field of Classification Search
None
See application file for complete search history.

(56) References Cited

U.S. PATENT DOCUMENTS

2007/0170897 A1    7/2007  Williams
2014/0292395 A1*  10/2014  Wu ..................... H01L 29/4236
                                                                 327/434
(Continued)

FOREIGN PATENT DOCUMENTS

DE    102006029928 B3    9/2007
DE    102010027832 B3    7/2011

OTHER PUBLICATIONS

Wen et al., A Dual-Mode Driver IC with Monolithic Negative Drive-Voltage Capability and Digital Current-Mode Controller for Depletion-Mode GaN NEMT, IEEE Transactions on Power, vol. 32, Issue 1, abstract only.

(Continued)

*Primary Examiner* — Lincoln D Donovan
*Assistant Examiner* — Khareem E Almo
(74) *Attorney, Agent, or Firm* — TraskBritt

(57) ABSTRACT

A power circuit switching device includes two switching terminals; a high voltage depletion mode transistor and a low voltage enhancement mode transistor arranged in series between the two switching terminals; a control circuit having a first input for receiving a switching signal and a second input for receiving a signal for activating the device, the control circuit being configured to put the switching device into an inactive state or an active state; a driver circuit for applying the switching signal to the gate of the high voltage transistor, the driver circuit being supplied with a first voltage from a first voltage source (VDR+) and with a second voltage from a second voltage source (VDR−), the first and second voltages being respectively higher and lower than the threshold voltage of the high voltage transistor; and at least one programming module associated with the driver circuit, configured to program the incoming current which is to be injected at the gate of the high voltage transistor, and the outgoing current which is to be drawn (Continued)

from the gate; the programming module being able to be connected to a first and a second passive component for programming the incoming current and outgoing current, respectively.

15 Claims, 4 Drawing Sheets

(56) References Cited

U.S. PATENT DOCUMENTS

| | | | | |
|---|---|---|---|---|
| 2016/0006428 A1* | 1/2016 | Wang | ................... | H03K 17/16 |
| | | | | 327/109 |
| 2016/0248422 A1* | 8/2016 | Curatola | .............. | H03K 17/161 |
| 2018/0083617 A1* | 3/2018 | Wang | ................... | H02M 1/08 |

OTHER PUBLICATIONS

International Written Opinion for International Application No. PCT/FR2017/053208 dated Mar. 9, 2018, 7 pages.
International Search Report for International Application No. PCT/FR2017/053208 dated Mar. 9, 2018, 2 pages.

* cited by examiner

POWER CIRCUIT SWITCHING DEVICE

CROSS-REFERENCE TO RELATED APPLICATIONS

This application is a national phase entry under 35 U.S.C. § 371 of International Patent Application PCT/FR2017/053208, filed Nov. 22, 2017, designating the U.S. and published as International Patent Publication WO 2018/096265 A1 on May 31, 2018, which claims the benefit under Article 8 of the Patent Cooperation Treaty of French Patent Application Serial No. 1661533, filed Nov. 25, 2016, and of French Patent Application Serial No. 1750867, filed Feb. 2, 2017.

TECHNICAL FIELD

The present disclosure relates to a device for switching a dual-controlled power circuit, comprising a high voltage transistor in series with a low voltage transistor.

BACKGROUND

The document "A dual-mode Driver IC with Monolithic Negative Drive-Voltage Capability and Digital Current-Mode Controller for Depletion-Mode GaN HEMT" (Yue Wen and Al, IEEE Transaction on Power Electronic, 2016) describes, in particular, a switching device comprising a high voltage depletion mode transistor in series with a low voltage transistor in enhancement mode, each transistor being controlled separately.

The device comprises a first terminal, for receiving a switching signal, electrically connected, via a driver circuit, to the gate of the high voltage depletion mode transistor. The off-state of the high voltage depletion mode transistor is obtained by applying a negative voltage, below its threshold voltage, between the gate and the source of this transistor. As this negative voltage may not be available, for example, when turning on the switching device or when operating it in degraded mode, the device is equipped with a low voltage enhancement mode transistor, connected in series with the high voltage transistor.

The state-of-the-art switching device also includes a second terminal, for receiving a control signal, the second terminal being electrically connected to the gate of the low voltage transistor. The control signal makes it possible to switch the low voltage transistor to the off-state and check the open state of the switching device, even in the absence of a negative voltage applied to the gate of the high voltage transistor.

By controlling separately, in "dual control" each of the high and low voltage transistors connected in series, it is therefore possible to define the open or closed state of the switching circuit.

It should be remembered that a switching device may have an "active" operating mode that corresponds to the "normal" operating mode wherein the open or closed state of the device is controlled by the switching signal. It may also have an "inactive" operating mode that corresponds to the "low power" mode (dormant device) or the device commissioning mode (starting the "active" operating mode).

In this "inactive" operating mode, the switching device is in the open state and the individual active elements of the device are not electrically powered. This is the case, for example, of the driver circuit connected to the gate of the high voltage transistor. If there is no power supply, this circuit has a high impedance output, the voltage that applies to the gate of the high voltage transistor is then floating and uncontrolled. A possible overvoltage on the drain of the high voltage transistor can then, by coupling effect between the drain and the gate, maintain or switch the high voltage transistor in/to an on-state despite the deactivation of the switching device. In this case, the entire switched voltage applies to the terminals of the low voltage transistor. This voltage can be significant, for example, greater than 600V, and exceed the avalanche voltage that this transistor can withstand, leading to damage to the device.

In addition, the change from one operating mode to another may result in transient voltages or transient current paths between the switching terminals of the device. These voltages or currents are likely to damage the high voltage transistor or the low voltage transistor if the change from one operating mode to another is not perfectly controlled.

More generally, it is desirable to have a driver circuit that can be configured to be perfectly adjusted to the other elements of the circuit and its environment in order to limit the consequences of transient phenomena that may occur when switching from one operating mode to another, or when operating the device.

OBJECT OF THE INVENTION

This disclosure aims at, at least partially, remedying at least one of the issues mentioned above. In particular, it aims to provide a switching device that can selectively switch from an inactive mode to an active mode (and vice versa) without damaging the transistors that compose it. It generally aims to provide a switching device whose operation limits the risk of damage to the transistors of which it is composed, in active, inactive or transitional phases of switching from one mode to another.

BRIEF SUMMARY

In order to achieve one of these purposes, the subject matter of the disclosure proposes, in its broadest sense, a device for switching a power circuit comprising:
  two switching terminals;
  a high voltage depletion mode transistor and a low voltage enhancement mode transistor, arranged in series between the two switching terminals; a control circuit having a first input for receiving a switching signal and a second input for receiving an activating signal for activating the device. The control circuit is configured to put the switching device:
    in an inactive state, when the activating signal has a first level, wherein the low voltage transistor and the high voltage transistor are each switched to the off-state; and
    in an active state when the activating signal has a second level different from the first one, wherein the low voltage transistor is in an on-state and the switching signal is applied to the gate of the high voltage transistor.
  a driver circuit for applying the switching signal to the gate of the high voltage transistor, the driver circuit being supplied with a first voltage from a first voltage source and a second voltage from a second voltage source, the first and second voltage being respectively higher and lower than the threshold voltage of the high voltage transistor;
  at least one programming module associated with the driver circuit 4, the latter being configured to allow the programming of the incoming current I+, intended to be injected into the gate of the high voltage transistor 5, and the outgoing current I−, intended to be drawn from the gate; the programming module being respectively able to be connected to a first and a second passive component, to program the incoming current I+ and the outgoing current I−.

According to other advantageous and unrestrictive characteristics of the disclosure, taken alone or in any technically feasible combination:

the at least one programming module 15a, 15'a, 15b, 15'b is included in the driver circuit 4;

the at least one programming module 15a, 15'a, 15b, 15'b is external to the driver circuit 4 and connected thereto;

the switching device comprises two programming modules 15a, 15'a, 15b, 15'b, one able to be connected to the first passive component and intended to program the incoming current I+, and the other able to be connected to the second passive component and intended to program the outgoing current I−;

the first passive component and the second passive component are resistors $R_{on}$, $R_{off}$;

the first and second voltage sources are programmable;

the device comprises a transient signal generating module connected to the driver circuit, configured to control the transient evolution of the incoming and outgoing gate current at the gate of the high voltage transistor.

The disclosure also relates to a method for controlling a switching device, with the switching device comprising:

two switching terminals;

a high voltage transistor and an enhancement mode low voltage transistor arranged in series between the two switching terminals;

a control circuit having a first input for receiving a switching signal and a second input for receiving a signal for activating the device;

The process puts the switching device, in a controlled manner, into an inactive state, when the activating signal has a first level, wherein the low voltage transistor and the high voltage transistors are each switched to an off-state; and into an active state, when the activating signal has a second level different from the first level, wherein the low voltage transistor is switched to the on-state and the switching signal is applied to the gate of the high voltage transistor.

According to other advantageous and unrestrictive characteristics of the disclosure, taken alone or in any technically feasible combination:

the switching device comprises electrically active components supplied by voltage sources and wherein, in the inactive state, at least part of the voltage sources are turned off;

the transition from an inactive state to an active state includes the establishment of first and second voltage sources;

the establishment of the first and second voltage sources includes programming the voltage levels applied to the gate of the high voltage transistor, to control it so that it is in an on-state or an off-state;

the establishment of the first and second voltage sources includes the determination of the intensity of the currents respectively injected at or drawn from the gate of the high voltage transistor, to control it so that it is in an on-state or an off-state;

the switching from the inactive state to the active state is achieved if the voltages of the first and second voltage sources are correctly established only;

the switching from the active state to the inactive state includes a first step during which the high voltage transistor is switched to the off-state;

the switching from the active state to the inactive state comprises a second step, subsequent to the first step, during which the low voltage transistor is switched to the off-state;

the switching from the active state to the inactive state comprises a third step, subsequent to the second step, during which at least a part of the power supply voltage sources for the active elements of the switching device is controlled to switch off.

BRIEF DESCRIPTION OF THE DRAWINGS

Other characteristics and advantages of the disclosure will emerge from the detailed description of the disclosure that follows with reference to the appended figures on which.

DETAILED DESCRIPTION

Figure 1:
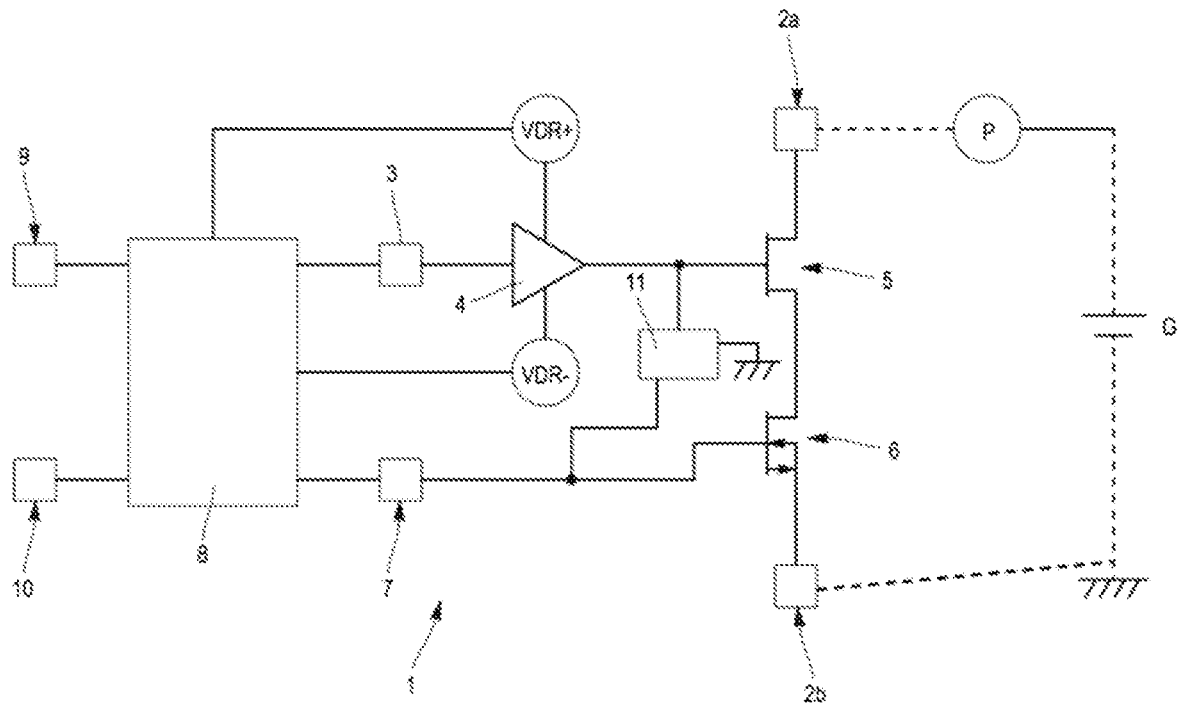
FIG. 1 shows a switching device according to the disclosure.

FIG. 1 shows a switching device 1 according to the invention. A load P and a generator G constituting a power circuit connected to two switching terminals 2a, 2b of the device 1 are shown in dotted lines in this figure.

The generator G can have a high voltage, for example, 600V or more, and the current flowing in the power circuit and in the switching device 1 can be a high-intensity current, for example, above 1 A. The switching device 1, as is well known per se, makes it possible to selectively apply the voltage of the generator G to the load P. It therefore acts as a power switch, controlled by a switching signal of a relatively small amplitude of the order of a few volts.

The switching device 1 has a first terminal 3 for receiving this switching signal. This first terminal 3 is electrically connected to the gate of a high voltage transistor 5 through a driver circuit 4.

To clear up any ambiguity, the terms "electrically connected" or "electrically linked" in this description are used to indicate that two elements are directly or indirectly connected to each other.

"High voltage transistor" means a transistor comprising a drain, a source and a gate, the low amplitude voltage applied to the gate (of the order of a few volts) enabling to make the connection between the drain and the source electrically in the on-state or in the off-state. In the off-state state, the voltage developing between the drain and the source can be of high amplitude, for example, 600V or more, without damaging the transistor.

A depletion mode (D-mode) high voltage transistor has a negative threshold voltage (typically between −6V and −2V). The voltage between the gate and the source must therefore be negative, below this threshold voltage, to switch this transistor to the off-state. The switching device according to the invention is particularly advantageous in the case of a D-mode high voltage transistor to control the open state of the switching device, even in the absence of a negative voltage applied to the gate of the high voltage transistor, for example, when turning on the switching device.

The high voltage transistor can be a HEMT, for example, GaN- or SiC-based transistor. This type of transistor has an avalanche voltage (i.e., the maximum voltage applicable between the transistor drain and source without damage thereto, it can be a breakdown voltage) of high amplitude, so selected as to be higher than the voltage of the power circuit generator, for example, above 600V.

In the normal or active operating mode of the switching device, the source of the high voltage transistor is at 0V. To enable the high voltage transistor to be controlled in the off-state or the on-state depending on the nature of the switching signal, the driver circuit 4 is connected to a first voltage source VDR+ and a second voltage source VDR−. The driver circuit is supplied with a first voltage, from the first source VDR+, the magnitude of which is greater than the threshold voltage of the high voltage transistor. For example, it may be a voltage of 2V, in the case of a D-mode high voltage transistor. The driver circuit is also supplied with a second voltage, from the second source VDR−, the magnitude of which is lower than the threshold voltage of the high voltage transistor. For example, it may be −8 V, in the case of a D-mode high voltage transistor. Depending on the value of the switching signal applied to the first input terminal 3, the first voltage or the second voltage is applied to the gate of the high voltage transistor, selectively switching it to an on-state or an off-state.

Following the description of the switching device 1 in FIG. 1, the high voltage transistor 5 is arranged in series with a low voltage transistor 6 between the two switching terminals 2a, 2b. In other words, the drain of the high voltage transistor 5 is electrically connected to one of the two switching terminals 2a, the source of the high voltage transistor 5 is connected to the drain of the low voltage transistor 6, and the source of the low voltage transistor 6 is connected to the other one of the two switching terminals 2b.

The low voltage transistor is advantageously an enhancement mode transistor with a positive threshold voltage. The voltage between the gate and the source must therefore be positive and higher than this threshold voltage, to switch this transistor to an on-state. It will be understood in the context of this invention that the avalanche voltage of the low voltage transistor 6 is lower than the avalanche voltage of the high voltage transistor 5.

The low voltage transistor can be a silicon-based MOSFET transistor. The avalanche voltage of the low voltage transistor is lower than that of the high voltage transistor. It can be, for example, equal to approximately 30V.

A second terminal 7 of the switching device 1 is connected to the gate of the low voltage transistor 6. This second terminal 7 is designed to receive a control signal.

As shown in the schematic diagram in FIG. 1, a control signal, corresponding to a positive voltage and higher than the threshold voltage of the low voltage transistor 6, applied to the second terminal 7, switches the low voltage transistor 6 to an on-state, the source of the low voltage transistor 6 being connected to the circuit ground. In this first operating mode (which corresponds to the normal active operating state of the device 1), the open or closed state of the switching device 1 is dictated by the switching signal applied to the first terminal 3; indeed, the switching signal, via the driver circuit 4, can selectively switch the high voltage transistor 5 to an on-state or to an off-state mode.

On the contrary, when the control signal with a voltage below the threshold voltage of the low voltage transistor 6 is applied to the second terminal 7, the low voltage transistor 6 switches to an off-state mode. In this inactive operating mode, the switching device 1 is in the open state, regardless of the value of the switching signal applied to the first input terminal 3. It should be reminded that when the device 1 is in this open state, with the control signal having a voltage below the threshold voltage of the low voltage transistor, the drain of this transistor has a floating voltage which, drawn by the leakage current of the high voltage transistor, is established at the avalanche voltage of the low voltage transistor, which as mentioned above can be 30V.

The switching device 1 also includes a control circuit 8 for processing the control signal and/or transmitting the switching signal, depending on the active or inactive operating mode of the switching device 1. The control circuit 8 has two outputs, respectively, electrically connected to the first terminal 3 and to the second terminal 7. The control circuit 8 also includes a first input 9 for receiving the switching signal and a second input 10 for receiving an activating signal to activate the device 1.

To enable the control circuit 8 to check the turning on, turning off and proper operation of the voltage sources VDR+, VDR−, the control circuit 8 is connected to these power sources via electrical connections (shown in FIG. 1).

According to one aspect of the invention, the control circuit 8 forms a state machine to place the device 1 in one of the "active" or "inactive" operating modes and to control the transition between these modes in complete safety. The control circuit 8 can be realized in an integrated form, for example, as a programmable logic gate system, or as discrete components, or even as a microcontroller properly programmed to reproduce the behavior detailed below.

The control circuit 8 is electrically connected to the gates of the high voltage transistor 5 and low voltage transistor 6 to control the off-state or on-state of these transistors, particularly when the device 1 switches from one operating mode to another. By individually and directly controlling the transistor gates, the transient effects that could develop and damage one of the transistors can be prevented. This also protects against unsecured operation of the device.

Figure 2:
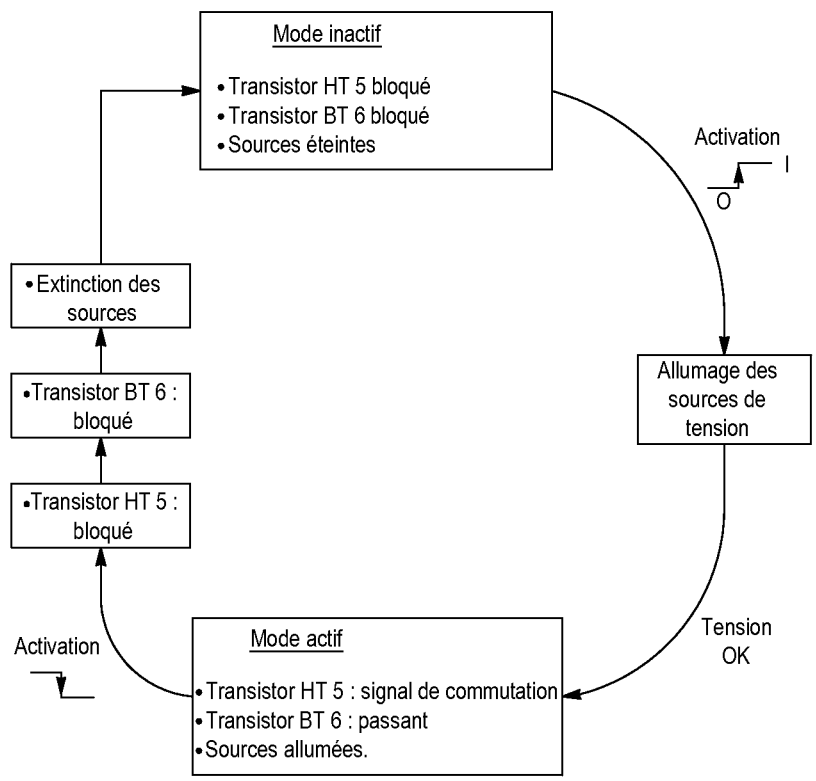
FIG. 2 shows the diagram of the transition between an active and an inactive mode of a switching device according to the invention.

As schematically represented by the transition model in FIG. 2, the mode of operation of the device 1 is determined by the level of an activating signal applied to the second input 10 of the control circuit 8. When this activating signal has a first level (e.g., 5V), the switching device 1 is controlled in normal, i.e., active operation.

In this operating mode, the control circuit 8 applies a control signal to the second terminal 7 with a voltage higher than the threshold voltage of the low voltage transistor 6 so that it is in an on-state. At the same time, the control circuit 8 transmits the switching signal, which is applied to the first input 9 of the control circuit 8, to the first terminal 3, in order to control the switching of the high voltage transistor 5 via the driver circuit 4. In this operating mode, the power supply voltage sources VDR+, VDR− of the active elements of the device 1 are controlled by the control circuit 8 to be in operation, i.e., to deliver a first and second voltage equal to their set voltages to within 10%.

In this operating mode too, a protection circuit 11 (described in greater details below) is inactive, i.e., it is controlled to be open.

When the activating signal has a second level, different from the first one (e.g., 0V), the device 1 is in an inactive operating ("stand-by") mode. In this operating mode, the control circuit 8 applies a control signal to the second terminal 7 with a voltage lower than the threshold voltage of the low voltage transistor 6 in order to switch it to the off-state. At the same time, the control circuit 8 applies a zero or sufficiently low blocking voltage to the first terminal 3 so that the high voltage transistor 5 is in an off-state via the driver circuit 4. In this inactive operating mode, the voltage sources supplying power to the active elements of the device, and, in particular, to the driver circuit 4, are controlled by the control circuit to be turned off. For this purpose, and as indicated above, the control circuit 8 is connected to the first and second power supplies VDR+ and VDR− (FIG. 1), to control the turning on and off thereof. This connection can be a communication bus connecting certain supply voltage sources of the device 1, such as the first and second sources VDR+ or VDR− of the driver circuit 4. This communication bus can also be used to activate other features of the driver circuit 4 as described in detail later in this disclosure.

The activation of the switching device 1, i.e., the change from the inactive to the active mode, is detected by the control circuit 8 on a rising edge of the activating signal. On this rising edge, the control circuit 8 initiates the establishment of the voltage sources that supply the active elements of the device.

When these are well established, the control circuit 8 places the device 1 in the active operation mode as described above. If these voltages cannot be established correctly, the control circuit 8 keeps the device 1 in the inactive mode, i.e., both the high voltage transistor 5 and the low voltage transistor 6 are controlled to be in an off-state. The control circuit 8 may indicate this malfunction by means of an additional signal (not shown in FIG. 1).

"Correctly establishing the voltage sources," means that they deliver a voltage equal to their set voltages to within 10%. The control circuit 8 is connected to the voltage sources VDR+, VDR− which allows it to receive the voltages actually delivered by these sources and to compare them with the set voltages. The control circuit is thus able to detect their good operating condition.

The deactivation of the switching device 1, i.e., the switching from the active mode to the inactive mode, is detected by the control circuit 8 on a falling edge of the activating signal. On this falling edge, the control circuit 8 triggers, in a first step, the application of a zero or sufficiently low blocking voltage on the first terminal 3 to switch the high voltage transistor 5 to the off-state, via the driver circuit 4. Then, in a second step, the control circuit 8 applies a voltage to the second terminal 7, switching the low voltage transistor 6 to the off-state. The control circuit 8 then controls the extinction of the voltage sources supplying the active elements of the device 1 and therefore the voltages delivered by the first and second sources VDR+, VDR− can no longer be guaranteed.

The deactivation of the switching device 1 may be caused by events other than a falling edge of the activating signal. This may, for example, be an event indicating a failure or an event that could cause a failure of the switching device. For example, if, when the switching device 1 is in the active mode, the control circuit 8 detects that the first voltage and/or the second voltage delivered by the voltage sources VDR+, VDR− of the driver circuit 4 deviate by more than 10% from their set values, it may cause the device 1 to switch to the inactive state.

The activation and deactivation of the device 1 according to the invention makes it possible to limit or even eliminate the occurrence of transient voltages or transient current paths between the switching terminals of the device 1, due to the fact that the voltages from the first and second voltage sources VDR+ and VDR− are correctly established during the activation, and that the high voltage transistor is switched to the blocking mode before the voltage sources are turned off during deactivation.

As an alternative to what has been disclosed, it is possible to provide for the activation of the switching device 1 to be carried out on a falling edge of the control signal, and for its deactivation to be carried out on a rising edge of this signal.

As seen in the preamble to this application, in the inactive mode of the switching device 1, the gate of the high voltage transistor 5 has a floating voltage, which can be affected by the voltage developing on the drain of the high voltage transistor 5 due to the coupling effect. This transistor can then move uncontrolled from an off-state to an on-state, which can damage the switching device 1, in particular, the low voltage transistor 6.

In order to prevent this phenomenon, the switching device 1 includes, according to another aspect of the invention, a protection circuit 11 normally in an on-state and electrically connected between the second terminal 7 and the gate of the high voltage transistor 5.

The function of the protection circuit 11 is to make and keep the high voltage transistor 5 in the off-state when the driver circuit 4 is not electrically powered. The protection circuit 11 is normally in an on-state, it does not need to be electrically powered to perform its function, and it can operate even in the absence of the supply voltages of the device 1, when it is deactivated. When the switching device is in the active operating mode, the protection circuit is controlled to be deactivated. It therefore constitutes an integrated safety ("fail safe") protection circuit.

When the switching device 1 is inactive, the output of the driver circuit 4 has a high impedance. The gate voltage of the high voltage transistor 5 is therefore floating and uncontrolled. The protection circuit 11 therefore aims to place this voltage at a given value, thus switching the high voltage transistor 5 to the off-state. This avoids applying the entire voltage of the generator G to the terminals of the low voltage transistor 6, which could damage it.

Figure 3:
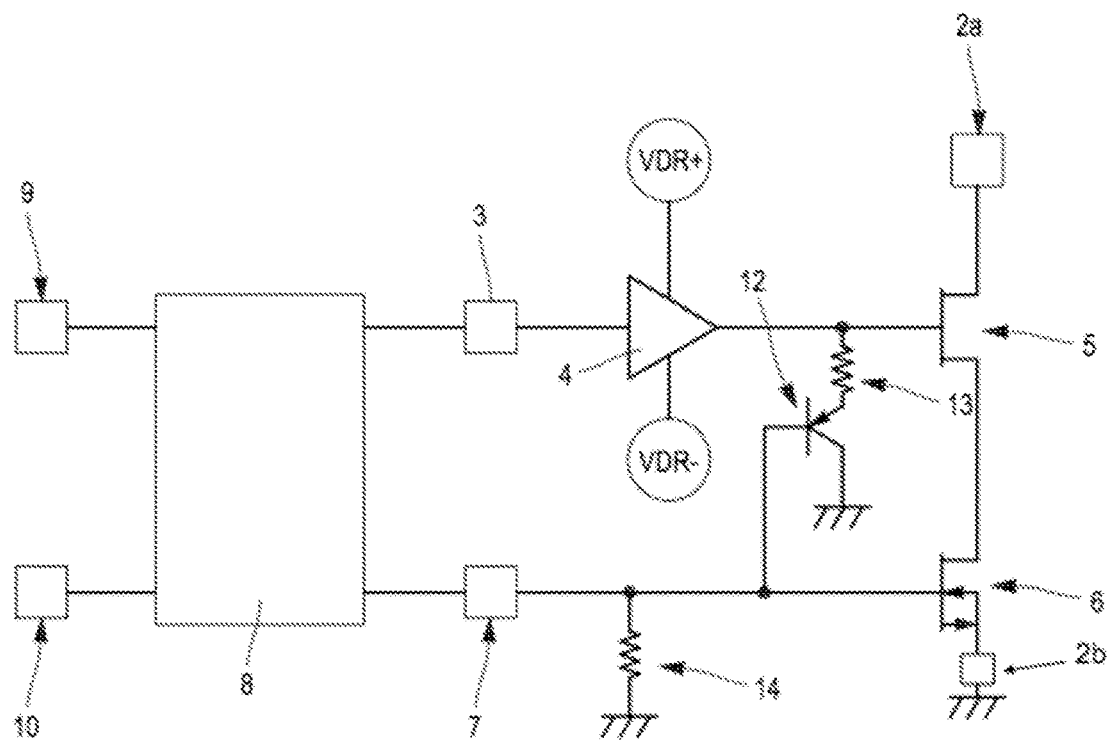
FIG. 3 illustrates a first exemplary embodiment of the invention.

FIG. 3 illustrates a first embodiment of the invention. The two switching terminals 2a, 2b, the high voltage transistor 5, the low voltage transistor 6, the driver circuit 4, the control circuit 8 and the two terminals 3, 7 already described in relation to the general description of the invention can be identified in this figure.

The protection circuit 11 consists of a PNP bipolar transistor 12 and a resistor 13 placed in the emitter of the bipolar transistor 12. The base of the bipolar transistor 12 is electrically connected to the second terminal 7. The collector is grounded to the device 1 and the electrical resistor 13 connected to the gate of the high voltage transistor 5.

The protection circuit also includes a second resistor 14, between the second input terminal 7 and the ground of the device 1.

When the control signal of the device 1 is higher than the threshold voltage of the low voltage transistor 6, and therefore when the switching device 1 is in the active operation mode, the bipolar transistor 12 is open and the protection circuit 11 has no influence on the operation of the high voltage transistor 5 and therefore of the switching device 1 as a whole.

More precisely, this condition is met when the voltage of the bipolar transistor 12 base is higher than the voltage of its emitter. The base voltage corresponds to the control of the gate of the low voltage transistor 6. The transmitter voltage is alternately equal to the first and to the second voltage delivered by the voltage sources VDR+, VDR− of the driver circuit. To ensure that the bipolar transistor 12 is effectively opened during the normal operation of the device, the control voltage of the low voltage transistor 6 is selected to be higher than the first voltage delivered by the voltage source VDR+ of the driver circuit 4.

If, on the other hand, the control signal of the switching device 1 is lower than the threshold voltage of the low voltage transistor 6, and therefore when the switching device 1 is in the inactive operation mode, the bipolar transistor 12 is closed on the first grounded resistor 13. The circuit that is formed then leads to having the voltage of the gate of the high voltage transistor 5 close to 0V. The source of the high voltage transistor 5 is put, when the low voltage transistor 6 is in an off-state mode, substantially at the avalanche voltage of this low voltage transistor (which can be of the order of 30V). A voltage is therefore applied between the gate and the source of the high voltage transistor 5 that is lower than its threshold voltage, guaranteeing the off-state thereof.

Although a switching device 1 was presented combining a protection circuit 11 and a control circuit 8, each of these elements can be operated separately in switching devices with a different architecture than the one just described.

In a particular embodiment of a switching device 1 according to the invention, the driver circuit 4 has an adaptable configuration, i.e., it can be configured to drive different types of high voltage transistors with different threshold voltages.

It should be remembered that high voltage transistors may have different threshold voltages, these differences may have their origins in the specification of the product itself or in the inevitable variability of the manufacturing process.

A driver circuit 4 with an adaptable configuration has the advantage of being usable regardless of the type of high voltage transistor chosen to be incorporated into the switching device 1. The first and second voltage sources VDR+, VDR− can be programmed to provide first and second voltage values adapted to the selected high voltage transistor 5 type. As the gate of the high voltage transistors is considered fragile, the driver circuit 4 with an adaptable configuration has the advantage of being able to be paired with the chosen high voltage transistor 5, thus limiting the risks of damage to the transistor due to transient voltages. The first and second voltage sources VDR+, VDR− of the driver circuit 4 can thus be so configured that the voltages they generate have a sufficient margin with the particular threshold voltage of the selected transistor.

The programming of the voltage levels of the first source VDR+ and the second source VDR− is advantageously carried out by binary words, stored in memory cells of each voltage source VDR+, VDR−.

Preferably, at least three bits (i.e., 8 levels) are used to program with sufficient resolution the values of the second voltage of the second source VDR−. These values will be included in the [−5V; −15V] range, for example, which corresponds to a range of second voltages capable of blocking different types of high voltage transistors, threshold voltages for example, included in this range (D-mode).

Similarly, at least three bits may be used to program the values of the first voltage of the first source VDR+ with sufficient resolution. These values can, for example, be included in the [+2V; +8V] range, which corresponds to a range of first voltages capable of switching different types of high voltage transistors to the on-state.

Alternatively, at least two bits (4 levels) may be used to program voltage excursion values with sufficient resolution with respect to a first or a second reference voltage.

For example, considering the second 3-bit VDR-programmable source (corresponding here to the reference voltage), the values of the first voltages of the first source VDR+ will be derived from the sum of a second voltage value and a voltage excursion value. According to an alternative embodiment, the reference voltage may be the first voltage, and the second voltage will then be defined by the sum of the first voltage and a negative excursion value.

Depending on the voltage value and the desired voltage resolution, it is of course possible to use a smaller number of bits or a larger number of bits for programming the voltage sources VDR+, VDR−.

As previously mentioned, the control circuit 8 is connected to the driver circuit 4 by a communication bus, allowing to configure each of the first and second voltage sources VDR+ and VDR− and to select the levels of the first voltage and the second voltage, respectively. The most suitable levels, and the associated binary words, can be determined upon completion of the manufacturing of the device 1, for example, during a test and configuration phase. The binary words corresponding to the selected voltage levels can be stored in a non-volatile memory of the control circuit 8. The configuration of the first and second voltage sources VDR+, VDR− of the driver circuit 4 can be carried out using the communication bus, during the establishment of the voltage sources, when the switching device 1 switches from the inactive state to the active state. Alternatively, the binary words corresponding to the selected voltage levels can be saved once and for all in non-volatile memories of the first and second voltage sources VDR+, VDR− of the driver circuit 4 upon completion of the manufacturing of the device 1.

Thus, whatever the type and specificities of the high voltage transistor 5 included in the switching device 1, the control circuit 8 allows to adapt more accurately the first and second voltages that will be applied thereto by the driver circuit 4 to switch it to the on-state or the off-state. This feature helps to make the switching device 1 particularly robust and secure.

According to another embodiment of a switching device 1 in accordance with the invention, the driver circuit 4, connected to the gate of the high voltage transistor 5, is configured to allow the injected gate current to be controlled and optimized, i.e., "incoming" current at the gate of the high voltage transistor 5 to switch it to the on-state; it is also configured to allow the drawn gate current, i.e., "outgoing" current from the gate of the high voltage transistor 5 to be controlled and optimized to be in an off-state.

The control and optimization of the gate current of the high voltage transistor 5 aims to limit the creation of electromagnetic interference EMC and to minimize switching losses. Indeed, the higher the intensity of the gate current, the shorter the switching time; and the shorter the switching time, the less switching losses there are, but the more electromagnetic disturbances there are.

It is therefore useful to be able to control and optimize the incoming and outgoing gate currents in order to establish optimal operation both in terms of switching losses, electromagnetic disturbances, and parasitic voltages and currents in transient phases. This optimal operating point is not defined per se, it can be related to the particular use of the switching device 1. It is therefore interesting to provide the means enabling a user to select the optimal operating conditions of the device in its environment.

As seen above, the driver circuit 4 is powered with a first voltage, from a first source VDR+, and with a second voltage, from a second source VDR−.

To determine the intensity of the incoming and outgoing gate currents, the driver circuit 4 is associated with at least one programming module. This programming module can be included in the driver circuit 4 or alternatively be located outside the driver circuit 4 and connected thereto.

Advantageously, the driver circuit 4 is equipped or connected to a first and a second programming module 15a, 15b. Each programming module 15a, 15b acts as an analog-to-digital converter to convert an analog voltage into a plurality of selection signals.

Each programming module 15a, 15b has an input terminal 16a, 16b suitable for connection to a first and a second passive component; these passive components may, for example, be of a resistive or capacitive nature, preferably arranged outside the switching device 1 to be accessible and modifiable by a user.

Advantageously, the first passive component and the second passive component are formed by a first external resistor $R_{on}$ and a second external resistor $R_{off}$. These first and second resistors can be placed on the printed circuit to be integrated in the switching device 1. The first resistor $R_{on}$ is connected to the input terminal 16a of the first incoming current programming module 15a and the second resistor $R_{off}$ is connected to the input terminal 16b of the second outgoing current programming module 15b. As the resistors $R_{on}$ and $R_{off}$ are accessible outside the housing of the switching device 1, for example, on the printed circuit, they can be freely selected by the user.

Depending on the value of the resistor $R_{on}$, the input terminal 16a of the programming module 15a being powered by a current source, a voltage develops at the terminals of the resistor. The value of this (analog) voltage is interpreted by comparators of the first programming module 15a and decoded to establish selection signals $S^+_n$ at the output of the module, which are transmitted to the driver circuit 4, to allow the programming of the incoming current.

The same operating principle applies to the second programming module 15b, for programming the outgoing current.

Figure 4A:
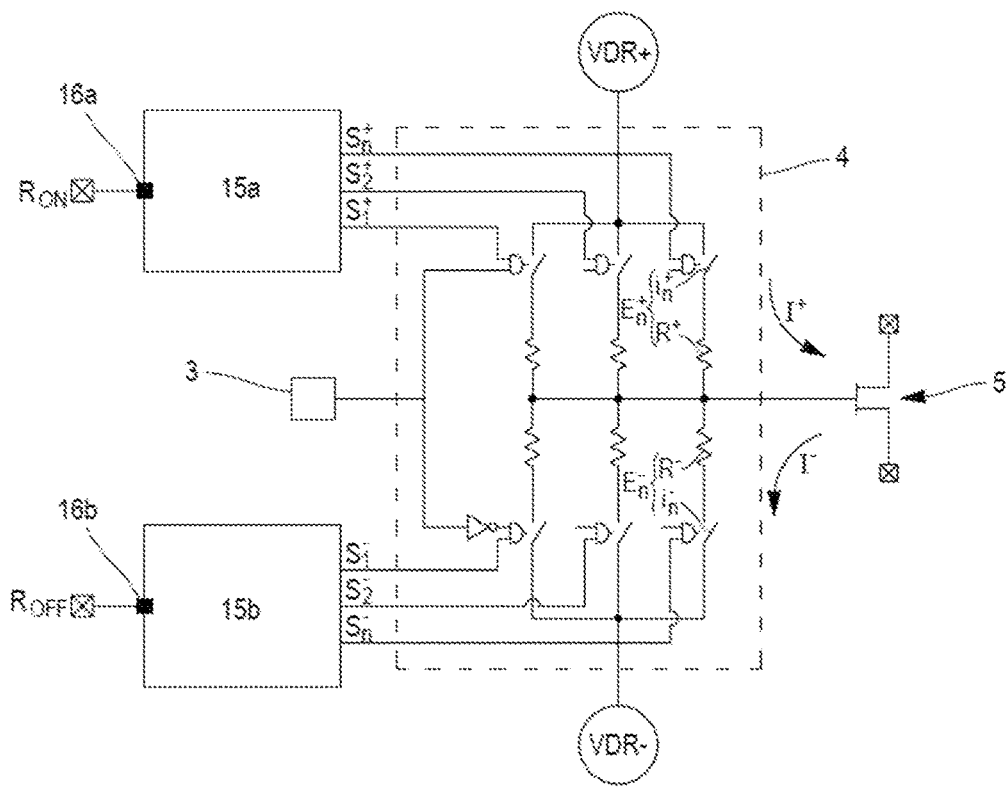
FIGS. 4a, 4b and 4c show block diagrams of a part of the switching device according to particular embodiments of the invention.

According to a first option, the driver circuit 4 is configured to allow the discrete programming of the incoming gate current and the outgoing gate current at the gate of the high voltage transistor 5 (FIG. 4a).

The driver circuit 4 comprises a plurality of current sources $E^+_n$, connected in parallel between the first source VDR+ and the gate of the high voltage transistor 5 and intended to manage the incoming gate current I+; it also comprises a plurality of current sources $E^-_n$ connected in parallel between the second source VDR− and the high voltage transistor 5 and intended to manage the outgoing gate I−.

For example, each current source $E^+_n$ (respectively $E^-_n$) could include a switch $i^+_n$ (respectively $i^-_n$) connected in series with a resistor R+ (respectively R−) placed between the switch and the gate of the high voltage transistor 5, as shown in the block diagram in FIG. 4a. Each switch $i^+_n$ (respectively $i^-_n$) corresponds to a logic gate ("AND") capable of closing according to the signal delivered by the terminal 3, applied to the input of the driver circuit 4 and to (at least) one selection signal $S^+_n$ (respectively $S^-_n$).

This selection signal $S^+_n$, $S^-_n$ is set at the output of the incoming current programming module 15a and the outgoing current programming module 15b, respectively.

These programming modules 15a, 15b can possibly be included in the control circuit 8 (not shown). In this case, the selection signals can be transmitted to the driver circuit 4 via a communication bus. Alternatively, as mentioned above, the programming modules 15a, 15b can be integrated into the driver circuit 4 proper.

The operation of the switching device 1 is now described in this first option of the embodiment. For example, let us consider that the selection signal $S^+_1$ is activated; when the switching signal reaches the terminal 3, the current source $E^+_1$ of the driver circuit 4 is activated and a gate current $I^+_1$ supplied to the gate of the high voltage transistor 5. This incoming current $I^+_1$ will have a value defined by the resistor R+ and by the first voltage from the first voltage source VDR+. If the signals $S^+_1$ and $S^+_2$ had been activated, a higher intensity gate current $I^+_{1+2}$ would have been provided to the gate of the high voltage transistor 5.

Thus, it is possible to control and optimize the (incoming) gate current I+ supplied to the gate of the high voltage transistor 5, by choosing the first resistor $R_{on}$, accessible outside the device housing, at the printed circuit.

Similarly, depending on the value of the second resistance $R_{off}$, one or more of the different selection signals $S^-_n$ is (are) activated at the output of the outgoing current programming module 15b, which also modulates the intensity of the current from the gate of the high voltage transistor 5, when the blocking signal is sent to the input of the driver circuit 4 to switch the transistor 5 to the off-state.

Thus, it is possible to control and optimize the (outgoing) gate current absorbed I−, by choosing the resistor $R_{off}$, accessible outside the housing of the switching device 1, at the printed circuit.

According to a variant of this first option, the programming of the incoming and outgoing currents can be carried out from a single programming module 15, comprising a single input terminal 16 suitable for connection to the first and second external resistors $R_{on}$, $R_{off}$ (or, more generally, to the first and second passive components).

Figure 4B:
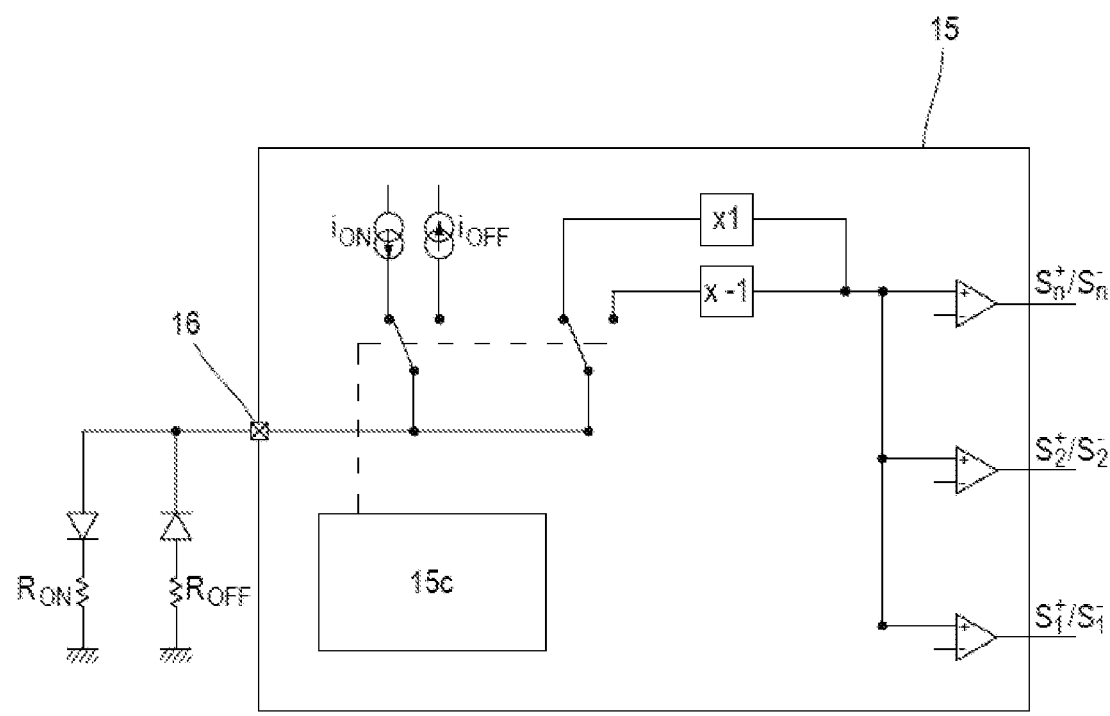

Each resistor $R_{on}$, $R_{off}$ is connected to the input terminal 16 by a diode in series, the two diodes being connected in opposite directions (FIG. 4b).

In this variant, the programming module 15 includes a sequencer 15c which will first allow the measurement of the first resistance $R_{on}$ by injecting a first current $i_{on}$ at the input terminal 16; the decoding of this resistance value by the programming module 15 then allows to establish the selection signals $S^+_n$ at the module 15 output for the incoming current. The sequencer will then allow the measurement of the second resistance $R_{off}$ by injecting a second current $i_{off}$ of the opposite sign to the first $i_{on}$ current, at the input terminal 16; the decoding of this resistance value by the programming module 15 allows to establish the selection signals $S^-_n$ at the module 15 output for the outgoing current.

The operation is also identical to the one described for the first option.

According to a second option of this embodiment, the driver circuit 4 is configured to allow the continuous programming of the gate current.

As in the previous option, modules 15′a, 15′b for programming the input current I+ and output current I− are advantageously included in the driver circuit 4. Alternatively, they may be placed externally and/or included in the control circuit 8; in this case, the first and second voltage sources may be connected to the driver circuit 4 via the programming modules.

The input and output current programming modules 15′a and 15′b are powered by the voltage source VDR+ and each has an input terminal 16'a, 16'b. Each terminal 16'a, 16'b is suitable for connection to a first and second resistor external to the switching device 1, referenced $R_{on}$ for the input terminal 16'a of the incoming current programming module 15'a and $R_{off}$ for the input terminal 16'b of the outgoing current programming module 15'b. As seen above, the first and second resistors, $R_{on}$, $R_{off}$ being accessible outside the housing defining the switching device 1, they can be freely chosen by the user. It should be noted that although resistors $R_{on}$, $R_{off}$ are described here, these could be replaced by two passive components of a different nature, capable of performing the same function.

Figure 5:
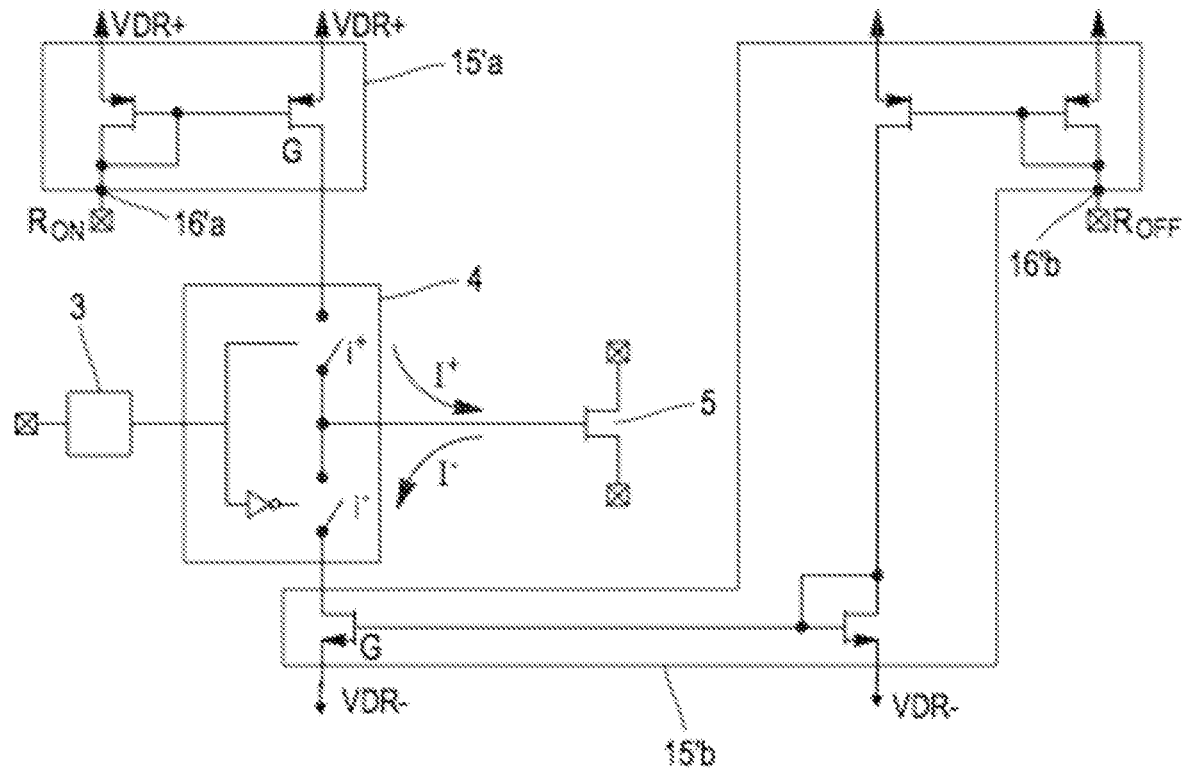
FIG. 5 shows a block diagram of a portion of the switching device according to another embodiment of the invention.

The driver circuit 4 includes at least one switch i+ between the first source VDR+ and the gate of the high voltage transistor 5, intended to manage the incoming gate current I+; it also includes at least one switch i− between the second source VDR− and the gate of the high voltage transistor 5, intended to manage the outgoing gate current I−, as shown on the block diagram in FIG. 5.

At the incoming current programming module 15'a, a current of given intensity will be established according to the value of the first resistor $R_{on}$, and interpreted by a gain current mirror component G included in the programming module 15'a. The ratio (gain=G) of the current mirror will help to adjust the value of the current I+ at the output of the incoming current programming module 15'a.

When the switching signal is applied to the terminal 3, at the input of the driver circuit 4, the switch i+ switches to the on-state and injects the current I+ at the gate of the high voltage transistor 5.

Thus, it is possible to control and optimize the (incoming) gate current I+ supplied to the gate, by choosing the resistance $R_{on}$, accessible outside the device housing, at the printed circuit.

The same applies to the (outgoing) drawn gate current I−, controlled via the programming module 15'b of the outgoing current, by selecting the second resistance accessible outside the housing of the switching device 1, for example, at the printed circuit. The gain current mirror G is referenced as VDR−.

In the two options just presented, the electromagnetic fields emitted during the operation of the switching device 1 can affect the operation of the programming modules 15a, 15'a, 15b, 15'b. In particular, they may disturb the measurement of the voltage developing across the first and second resistors $R_{on}$ and $R_{off}$, which could lead to the generation of an unsuitable incoming and outgoing current. To avoid this problem, the programming modules are configured to establish and freeze the intensity of these currents during the step of establishing the first and second voltage sources, when the switching device 1 switches from the active state to the inactive state.

Advantageously, for both options previously described in this embodiment of the invention, the switching device 1 also makes it possible to control the time evolution of the incoming and outgoing gate current at the gate of the high voltage transistor 5, following the detection of a rising or falling edge of the switching signal.

Figure 6:
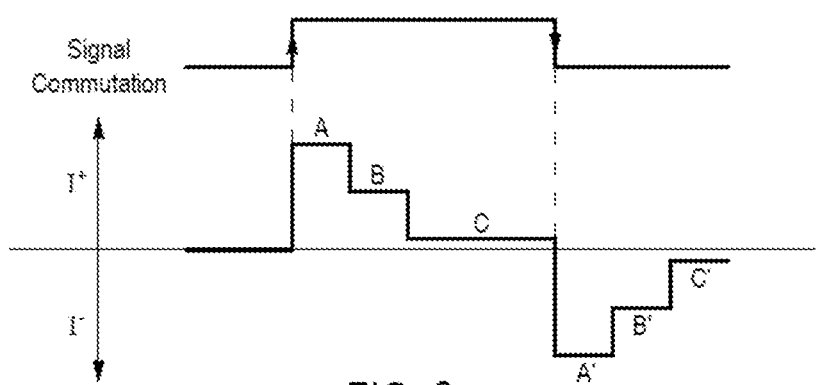
FIG. 6 shows an example of a time evolution diagram of the high voltage transistor gate current.

Different levels of (incoming and/or outgoing) gate currents can be established in time, as shown, for example, in FIG. 6.

On a rising edge of the switching signal, the incoming gate current I+ is first injected at a high level A, to quickly reach a value close to the threshold voltage and thus reduce the time for switching to the on-state. The gate current I+ is then reduced to an intermediate level B, to reach a gate voltage higher than the threshold voltage, substantially equal to the first voltage from the first source VDR+, able to maintain the transistor 5 in the on-state. Finally, the gate current is further reduced to a low level C, to maintain the high voltage transistor 5 in the on-state.

The outgoing gate current I− has a similar behavior. On a falling edge of the switching signal, the gate current is drawn (negative current) first at a high level A' for fast discharge (and a short switching time), then at an intermediate level B' to bring the gate voltage to a value substantially equal to the second voltage from the second source VDR− (able to maintain the transistor 5 in the off-state); finally, the gate current I− is drawn at a low level C', to maintain the high voltage transistor 5 in the off-state.

Figure 4C:
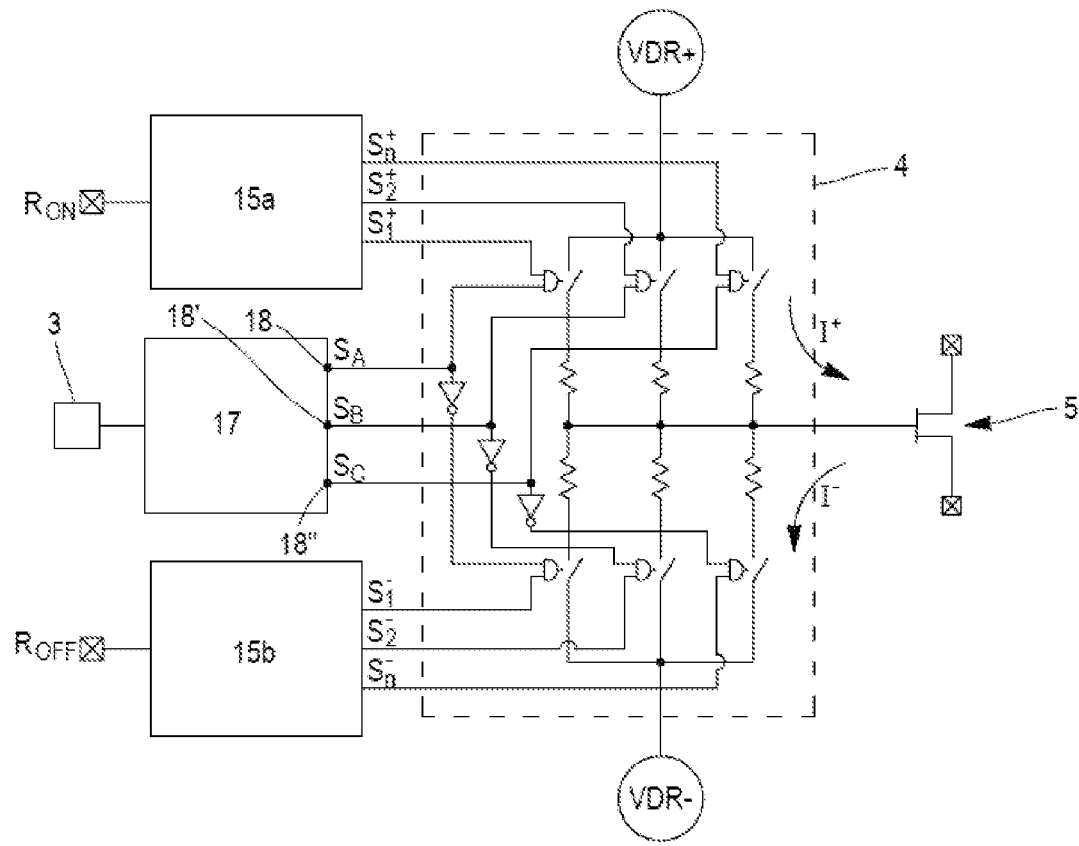

To control the transient evolution of the incoming or outgoing gate current, the switching device 1 according to this embodiment of the invention comprises a module for generating transient signals 17 between the first terminal 3 and the driver circuit 4, as shown in FIG. 4c. This transient signal generating module 17 comprises an input connected to the first terminal 3 and a plurality of outputs 18, 18', 18" electrically connected to the switch(es) of the driver circuit 4. The signals $S_A$, $S_B$ and $S_C$ from the outputs 18, 18', 18" act as switching or off-state signals for the driver circuit 4, at the output of which the different levels A, B, C or A', B', C', of incoming I+ or outgoing I− gate currents will be generated.

The transient signal generating module 17 can be included in the control circuit 8 or in the driver circuit 4.

The switching device 1 according to the different embodiments and options described above can switch from an inactive mode to an active mode (and vice versa) without damaging the transistors that compose it; its operation also limits the risks of damage to the transistors that compose it, in the active or inactive mode or during the transitional phases of switching from one mode to another.

Of course, the invention is not limited to the embodiments described and alternative embodiments can be made without going beyond the scope of the invention as defined by the claims.

The invention claimed is:

1. A power circuit switching device, comprising:
   two switching terminals;
   a high voltage depletion mode transistor and a low voltage enhancement mode transistor arranged in series between the two switching terminals;
   a control circuit having a first input for receiving a switching signal and a second input for receiving an activating signal for activating the device, the control circuit being configured to put the switching device:
   into an inactive state, when the activating signal has a first level, wherein the low voltage transistor and a high voltage transistor are each in an off-state; and
   and in an active state when the activating signal has a second level different from the first level, wherein the low voltage transistor is in an on-state and the switching signal is applied to a gate of the high voltage transistor;
   a driver circuit for applying the switching signal to the gate of the high voltage transistor, the driver circuit being supplied with a first voltage from a first voltage source (VDR+) and a second voltage from a second voltage source (VDR−), the first and second voltage being respectively higher and lower than a threshold voltage of the high voltage transistor; and
   at least one programming module associated with the driver circuit, the latter being configured to enable the programming of an incoming current ($I^+$), intended to be injected at the gate of the high voltage transistor, and an outgoing current (I⁻), intended to be drawn from the gate; the programming module being able to be connected to a first and a second passive component, for programming the incoming current (I+) and the outgoing current (I) respectively.

2. The power circuit switching device of claim 1, wherein the at least one programming module is included in the driver circuit.

3. The power circuit switching device of claim 2, further comprising two programming modules, with one being able to be connected to the first passive component and intended to program the incoming current (I+), and the other one being able to be connected to the second passive component and intended to program the outgoing current (I).

4. The power circuit switching device of claim 3, wherein the first and second passive components are resistors ($R_{on}$, $R_{off}$).

5. The power circuit switching device of claim 4, wherein the first and second voltage sources (VDR+, VDR−) are programmable.

6. The power circuit switching device of claim 5, further comprising a transient signal generating module connected to the driver circuit configured to control a transient evolution of the incoming (I+) and outgoing (I) gate current at the gate of the high voltage transistor.

7. The power circuit switching device of claim 1, wherein the at least one programming module is external to, and connected to the driver circuit.

8. The power circuit switching device of claim 7, further comprising two programming modules, with one being able to be connected to the first passive component and intended to program the incoming current (I+), and the other one being able to be connected to the second passive component and intended to program the outgoing current (I).

9. The power circuit switching device of claim 8, wherein the first and second passive components are resistors ($R_{on}$, $R_{off}$).

10. The power circuit switching device of claim 9, wherein the first and second voltage sources (VDR+, VDR−) are programmable.

11. The power circuit switching device of claim 10, further comprising a transient signal generating module connected to the driver circuit configured to control a transient evolution of the incoming (I+) and outgoing (I) gate current at the gate of the high voltage transistor.

12. The power circuit switching device of claim 1, comprising two programming modules, with one being able to be connected to the first passive component and intended to program the incoming current (I+), and the other one being able to be connected to the second passive component and intended to program the outgoing current (I).

13. The power circuit switching device of claim 1, wherein the first and second passive components are resistors ($R_{on}$, $R_{off}$).

14. The power circuit switching device of claim 1, wherein the first and second voltage sources (VDR+, VDR−) are programmable.

15. The power circuit switching device of claim 1, further comprising a transient signal generating module connected to the driver circuit configured to control a transient evolution of the incoming (I+) and outgoing (I) gate current at the gate of the high voltage transistor.

\* \* \* \* \*